United States Patent
Xiao et al.

(10) Patent No.: US 9,112,533 B2
(45) Date of Patent: Aug. 18, 2015

(54) ENCODING METHOD, DECODING METHOD, ENCODING DEVICE, AND DECODING DEVICE

(71) Applicant: Huawei Technologies Co., Ltd., Shenzhen, Guangdong (CN)

(72) Inventors: Zhiyu Xiao, Chengdu (CN); Deyuan Chang, Shenzhen (CN); Fan Yu, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 414 days.

(21) Appl. No.: 13/723,031

(22) Filed: Dec. 20, 2012

(65) Prior Publication Data

US 2013/0132803 A1    May 23, 2013

Related U.S. Application Data

(63) Continuation of application No. PCT/CN2011/082362, filed on Nov. 17, 2011.

(51) Int. Cl.
H03M 13/13 (2006.01)
H03M 13/11 (2006.01)

(52) U.S. Cl.
CPC .......... *H03M 13/13* (2013.01); *H03M 13/1154* (2013.01)

(58) Field of Classification Search
CPC ... H03M 13/13; H04L 1/0057; H04L 1/0061; H04L 1/0041; H04L 1/0083; H04L 1/0072
USPC ........................................................ 714/776
See application file for complete search history.

(56) References Cited

U.S. PATENT DOCUMENTS 6,141,787 A    10/2000    Kunisa et al.
2005/0258984 A1    11/2005    Owsley et al.
(Continued)

FOREIGN PATENT DOCUMENTS

| CN | 85103579 A | 11/1986 |
|---|---|---|
| CN | 1777082 A | 5/2006 |
| CN | 1953335 A | 4/2007 |

OTHER PUBLICATIONS

Search Report dated Jul. 3, 2013 in connection with Chinese Patent Application No. 201180002418.0.
(Continued)

*Primary Examiner* — Albert Decady
*Assistant Examiner* — Kyle Vallecillo (57) ABSTRACT

The embodiments of the present invention provide an encoding and decoding method and device. The encoding method includes: equally dividing input K-bit information into n blocks, where $k_1, k_2, \ldots,$ and $k_n$ are used to represent each block of information; combining a $ki^{th}$ block of information with n−1 encoded code words $V_{i-1}, V_{i-2}, \ldots,$ and $V_{i-n+1}$ of $k_{i-1}{}^{th}, k_{i-2}{}^{th}, \ldots,$ and $k_{i-n+1}{}^{th}$ blocks, to obtain a code word to be encoded, where when a sequence number of an encoded code word is smaller than or equal to 0, the encoded code word is history information; performing, by using an LDPC check matrix, encoding on the code word to be encoded, where a generated check bit and the $k_i{}^{th}$ block of information form an encoded code word Vi; and outputting encoded code words $V_1, V_2, \ldots,$ and $V_n$. The embodiments of the present invention are applied in encoding and decoding.

11 Claims, 6 Drawing Sheets

---

An encoding device equally divides input K-bit information into n groups, where $k_1, k_2, \ldots,$ and $k_n$ are used to represent each group of information — S101

The encoding device combines a $k_i{}^{th}$ group of information with n − 1 encoded code words $V_{i-1}, V_{i-2}, \ldots,$ and $V_{i-n+1}$ of $k_{i-1}{}^{th}, k_{i-2}{}^{th}, \ldots,$ and $k_{i-n+1}{}^{th}$ groups, to obtain a code word to be encoded, where when a sequence number of an encoded code word is smaller than or equal to 0, the encoded code word is history information — S102

The encoding device performs, by using an LDPC check matrix, encoding on the code word to be encoded, where a generated check bit and the $k_i{}^{th}$ group of information form an encoded code word $V_i$ — S103

The encoding device outputs encoded code words $V_1, V_2, \ldots,$ and $V_n$, where the LDPC check matrix includes m layers, each layer includes N sub-matrixes, the N sub-matrixes are equally divided into n groups according to columns, and each group includes N/n sub-matrixes, where $i \in [1, n]$, and N, m, n, and i are all positive integers — S104

(56) References Cited

U.S. PATENT DOCUMENTS

| | | | |
|---|---|---|---|
| 2009/0113256 A1 | 4/2009 | Radosavljevic et al. | |
| 2009/0259907 A1* | 10/2009 | Chernyshev et al. | 714/748 |
| 2010/0077275 A1* | 3/2010 | Yu et al. | 714/752 |
| 2010/0199153 A1 | 8/2010 | Okamura et al. | |
| 2011/0029826 A1 | 2/2011 | Zhong et al. | |
| 2011/0066917 A1 | 3/2011 | Heinrich et al. | |
| 2011/0202817 A1* | 8/2011 | Hu et al. | 714/763 |

OTHER PUBLICATIONS

Written Opinion of the International Searching Authority dated Aug. 30, 2012 in connection with International Patent Application No. PCT/CN2011/082362.

International Search Report dated Aug. 30, 2012 in connection with International Patent Application No. PCT/CN2011/082362.

Yixiang Wang, et al., "Quasi-Cyclic Low-Density Parity-Check Convolutional Code", IEEE 7th International Conference on Wireless and Mobile Computing, Network and Communications, Oct. 10, 2011, p. 351-356.

Ali Emre Pusane, et al., "Implementation Aspects of LDPC Convolutional Codes", IEEE Transactions on Communications, vol. 56, No. 7, Jul. 2008, p. 1060-1069.

Alberto Jimenez, et al., "Time-Varying Periodic Convolutional Codes with Low-Density Parity-Check Matrix", IEEE Transactions on Information Theory, vol. 45, No. 6, Sep. 1999, p. 2181-2191.

\* cited by examiner

| H1_1 | H2_1 | H3_1 | H4_1 |
|------|------|------|------|
| H1_2 | H2_2 | H3_2 | H4_2 |
| H1_3 | H2_3 | H3_3 | H4_3 |
| H1_4 | H2_4 | H3_4 | H4_4 |

| H1_1 | H2_1 | H3_1 | H4_1 |
|------|------|------|------|
| H1_2 | H2_2 | H3_2 | H4_2 |
|      |      |      |      |
| H1_3 | H2_3 | H3_3 | H4_3 |
|      |      |      |      |
|      |      |      |      |
| H1_4 | H2_4 | H3_4 | H4_4 |

ENCODING METHOD, DECODING METHOD, ENCODING DEVICE, AND DECODING DEVICE

CROSS-REFERENCE TO RELATED APPLICATIONS

This application is a continuation of International Application No. PCT/CN2011/082362, filed on Nov. 17, 2011, which is hereby incorporated by reference in its entirety.

TECHNICAL FIELD

The present invention relates to the field of communications, and in particular, to an encoding method, a decoding method, an encoding device, and a decoding device.

BACKGROUND

In a high-speed information transmission system generally adopted at present, usually, it is required to perform FEC (Forward Error Correction, forward error correction) encoding on information to be sent at a transmitting end, and correct an error in a transmission link and output required information through a corresponding FEC decoder at a receiving end. FEC is such a technology that information is processed in a certain format in advance before the information is sent, and decoding is performed according to a specified algorithm at a receiving end, so as to find and correct an error code.

With development of the high-speed information transmission system, a higher requirement is also imposed on a FEC technology. An FEC encoder/decoder with high performance, a high throughput, and a low implementation difficulty is critical to system design. Using an LDPC (Low Density Parity Code, low density parity code) code with higher transmission performance to transmit information gradually becomes a mainstream encoding manner of the FEC technology.

The LDPC code is a type of FEC code word that may approach the Shannon limit and has a gain characteristic. LDPC encoding and decoding are both performed for a single block of information, and LDPC decoding is implemented through a check matrix (H matrix). The H matrix is an M×N matrix, where N is the length of a block code, K is the length of information, and M=N−K, which represents that M check equations exist. Each row of the H matrix represents one check equation. Generally, an LDPC block decoder divides M check equations into m layers, and each layer includes M/m check equations. A decoding process is that the LDPC block decoder checks one code word by using check equations of a $1^{st}$ layer to an $m^{th}$ layer respectively, and output information is fed back to an input end of the LDPC block decoder for multiple iterations until the decoding is completed.

Since performance of information transmission is restricted by an LDPC code length, in order to implement high-performance and high-throughput FEC encoding and decoding, a code length of the LDPC code is usually required to be quite long. However, the LDPC is a linear block code, and therefore, when a code length of information processed at a single time is longer, an implementation difficulty of a circuit is increased, and meanwhile, consumption of a logical resource is greatly increased, thereby seriously affecting performance of encoding and decoding.

SUMMARY

Embodiments of the present invention provide an encoding method, a decoding method, an encoding device, and a decoding device, so that a code length of information processed at a single time is shortened, thereby reducing an implementation difficulty of a circuit and improving performance of encoding and decoding.

In order to achieve the foregoing objective, the embodiments of the present invention adopt the following technical solutions.

In one aspect, an encoding method is provided and includes:

equally dividing input K-bit information into n blocks, where $k_1, k_2, \ldots,$ and $k_n$ are used to represent each block of information;

combining a $k_i^{th}$ block of information with n−1 encoded code words $V_{i-1}, V_{i-2}, \ldots,$ and $V_{i-n+1}$ of $k_{i-1}^{th}, k_{i-2}^{th}, \ldots,$ and $k_{i-n+1}^{th}$ blocks, to obtain a code word to be encoded, where when a sequence number of an encoded code word is smaller than or equal to 0, the encoded code word is history information;

performing, by using a low density parity code LDPC check matrix, encoding on the code word to be encoded, where a generated check bit and the $ki^{th}$ block of information form an encoded code word $V_i$; and outputting encoded code words $V_1, V_2, \ldots,$ and $V_n$, where the LDPC check matrix includes m layers, each layer includes N sub-matrixes, the N sub-matrixes are equally divided into n blocks according to columns, and each block includes N/n sub-matrixes, where i∈[1, n], and N, m, n, and i are all positive integers.

In another aspect, a decoding method is provided and includes:

forming input encoded code words $V_i, V_{i-1}, V_{i-2}, \ldots,$ and $V_{i-n+1}$ into one code word, and performing decoding by using an LDPC check matrix, to obtain a $ki^{th}$ block of information, where when a sequence number of the encoded code word is smaller than or equal to 0, the encoded code word is history information;

after obtaining $k_1^{th}, k_2^{th}, \ldots,$ and $k_n^{th}$ blocks of information after the decoding, combining them to obtain K-bit information; and outputting the K-bit information, where the LDPC check matrix includes m layers, each layer includes N sub-matrixes, the N sub-matrixes are equally divided into n blocks according to columns, and each block includes N/n sub-matrixes, where i∈[1, n], and N, m, n, and i are all positive integers.

In one aspect, an encoding device is provided and includes:

an encoding inputting unit, configured to input K-bit information;

an encoding processing unit, configured to equally divide the input K-bit information into n blocks, where $k_1, k_2, \ldots,$ and $k_n$ are used to represent each block of information; combine a $k_i^{th}$ block of information with n−1 encoded code words $V_{i-1}, V_{i-2}, \ldots,$ and $V_{i-n+1}$ of $k_{i-1}^{th}, k_{i-2}^{th}, \ldots,$ and $k_{i-n+1}^{th}$ blocks, to obtain a code word to be encoded, where when a sequence number of the encoded code word is smaller than or equal to 0, the encoded code word is history information; and perform, by using an LDPC check matrix, encoding on the code word to be encoded, where a generated check bit and the $k_i^{th}$ block of information form an encoded code word $V_i$; and an encoding outputting unit, configured to output encoded code words $V_1, V_2, \ldots,$ and $V_n$, where the LDPC check matrix includes m layers, each layer includes N sub-matrixes, the N sub-matrixes are equally divided into n blocks according to columns, and each block includes N/n sub-matrixes, where i∈[1, n], and N, m, n, and i are all positive integers.

In another aspect, a decoding device is provided and includes:

a decoding inputting unit, configured to input encoded code words $V_i, V_{i-1}, V_{i-2}, \ldots,$ and $V_{i-n+1}$;

at least one decoding processing unit, configured to form the input encoded code words $V_i, V_{i-1}, V_{i-2}, \ldots,$ and $V_{i-n+1}$ into one code word, and perform decoding by using an LDPC check matrix, to obtain a $ki^{th}$ block of information, where when a sequence number of the encoded code word is smaller than or equal to 0, the encoded code word is history information; and after obtaining $k_1^{th}, k_2^{th}, \ldots,$ and $k_n^{th}$ blocks of information after the decoding, combine them to obtain the K-bit information; and a decoding outputting unit, configured to output the K-bit information, where the LDPC check matrix includes m layers, each layer includes N sub-matrixes, the N sub-matrixes are equally divided into n blocks according to columns, and each block includes N/n sub-matrixes, where $i \in [1, n]$, and N, m, n, and i are all positive integers.

With the encoding method, decoding method, encoding device, and decoding device provided in the embodiments of the present invention, the input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

BRIEF DESCRIPTION OF THE DRAWINGS

To describe the technical solutions in the embodiments of the present invention or in the prior art more clearly, the accompanying drawings required for describing the embodiments or the prior art are introduced briefly in the following. Apparently, the accompanying drawings in the following descriptions are only some embodiments of the present invention, and persons of ordinary skill in the art may still obtain other drawings according to these accompanying drawings without creative efforts.

DETAILED DESCRIPTION

The technical solutions in the embodiments of the present invention are clearly and fully described in the following with reference to the accompanying drawings in the embodiments of the present invention. Apparently, the embodiments to be described are only a part rather than all of the embodiments of the present invention. Based on the embodiments of the present invention, all other embodiments obtained by persons of ordinary skill in the art without creative efforts shall fall within the protection scope of the present invention.

Figure 1:
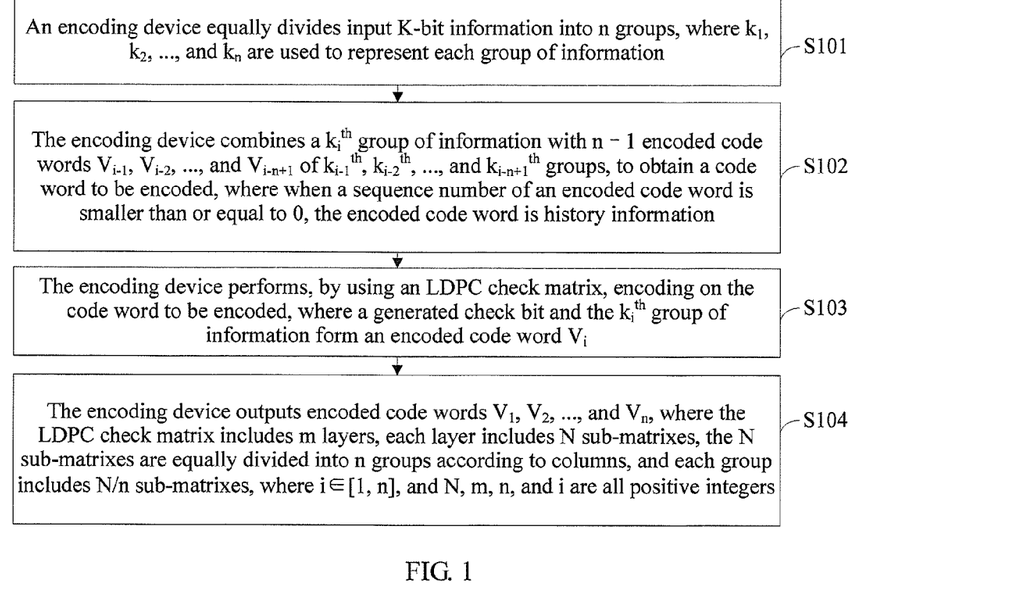
FIG. 1 is a schematic flow chart of an encoding method according to an embodiment of the present invention.

An encoding method provided in an embodiment of the present invention. as shown in FIG. 1, includes:

S101: An encoding device equally divides input K-bit information into n blocks, where $k_1, k_2, \ldots,$ and $k_n$ are used to represent each block of information.

S102: The encoding device combines a $k_i^{th}$ block of information with n−1 encoded code words $V_{i-1}, V_{i-2}, \ldots,$ and $V_{i-n+1}$ of $k_{i-1}^{th}, k_{i-2}^{th}, \ldots,$ and $k_{i-n+1}^{th}$ blocks, to obtain a code word to be encoded, where when a sequence number of an encoded code word is smaller than or equal to 0, the encoded code word is history information.

S103: The encoding device performs, by using an LDPC check matrix, encoding on the code word to be encoded, where a generated check bit and the $k_i^{th}$ block of information form an encoded code word $V_i$.

S104: The encoding device outputs encoded code words $V_1, V_2, \ldots,$ and $V_n$.

The LDPC check matrix includes m layers, each layer includes N sub-matrixes, the N sub-matrixes are equally divided into n blocks according to columns, and each block includes N/n sub-matrixes, where $i \in [1, n]$, and N, m, n, and i are all positive integers.

It should be noted that in the foregoing encoding method, the history information refers to an encoded code word of each block of information before the $k_1^{th}$ block of information is input. Because the $k_1^{th}$ block of information is a first block of input information in an encoding process, the history information may be a preset value, and the history information may also be equal to 0.

With the encoding method provided in this embodiment of the present invention, the input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

Figure 2:
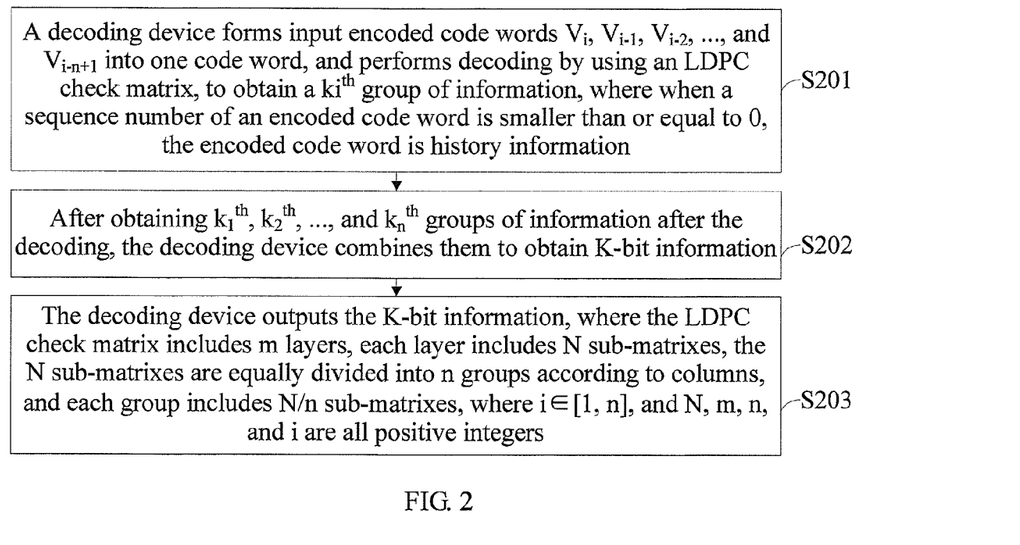
FIG. 2 is a schematic flow chart of a decoding method according to an embodiment of the present invention.

A decoding method provided in an embodiment of the present invention, as shown in FIG. 2, includes:

S201: A decoding device forms input encoded code words $V_i$, $V_{i-1}$, $V_{i-2}$, ..., and $V_{i-n+1}$ into one code word, and performs decoding by using an LDPC check matrix, to obtain a $ki^{th}$ block of information, where when a sequence number of an encoded code word is smaller than or equal to 0, the encoded code word is history information.

S202: After obtaining $k_1^{th}$, $k_2^{th}$, ..., and $k_n^{th}$ blocks of information after the decoding, the decoding device combines them to obtain K-bit information.

S203: The decoding device outputs the K-bit information.

The LDPC check matrix includes m layers, each layer includes N sub-matrixes, the N sub-matrixes are equally divided into n blocks according to columns, and each block includes N/n sub-matrixes, where $i \in [1, n]$, and N, m, n, and i are all positive integers.

It should be noted that, in the foregoing decoding method, the history information refers to an encoded code word of each block before an encoded code word of a $V_1^{th}$ block is input. Because the encoded code word of the $V_1^{th}$ block is a first block of input information in a decoding process, the history information may be a preset value, and the history information may also be equal to 0.

With the decoding method provided in this embodiment of the present invention, the input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

Figure 3A:
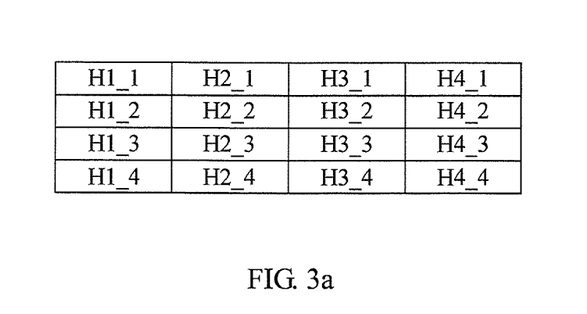
FIG. 3a is a schematic diagram of an original check matrix.

An embodiment of the present invention provides an encoding method, and based on a continuously extended check matrix, the method adopts a concatenated pipelined convolutional manner for encoding. An original check matrix is shown in FIG. 3a. A size of of the check matrix is m×N and the check matrix includes m layers, each layer represents one check equation, each layer includes N sub-matrixes, the N sub-matrixes are equally divided into n blocks according to columns, and each block includes N/n sub-matrixes, where m=4, n=4, and N=24. That is, the check matrix includes 4 layers, each layer has 4 columns, and each column includes 6 sub-columns (not shown in the figure). The check matrix is extended and transformed to obtain a check matrix H shown in FIG. 3b. The check matrix H is formed by an infinite number of original check matrixes that are connected end to end from left to right or from right to left, shifted down column by column from left to right, and extended to infinite, and each column still has 4 layers. Therefore, H1L, H2L, H3L, and H4L may be used respectively to represent a check equation of each layer cyclically. Exemplarily, H1L is a layer shown by a dashed line in FIG. 3b. A specific encoding process may be described as follows.

Figure 3B:
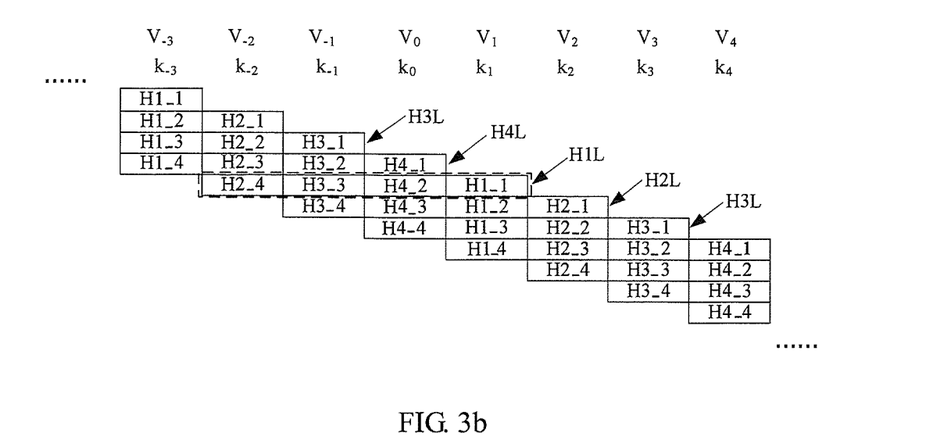
FIG. 3b is a schematic diagram of a check matrix obtained through extension and transformation according to an embodiment of the present invention.

Equally divide input K-bit information into 4 blocks, where $k_1$, $k_2$, $k_3$, and $k_4$ are used to represent each block of information.

Combine a $k_i^{th}$ block of information with 3 encoded code words $V_{i-1}$, $V_{i-2}$, and $V_{i-3}$ of $k_{i-1}^{th}$, $k_{i-2}^{th}$, and $k_{i-3}^{th}$ blocks, to obtain a code word to be encoded.

Perform, by using an LDPC check matrix, encoding on the code word to be encoded, where a generated check bit and the $k_i^{th}$ block of information form an encoded code word $V_i$, and $i \in [1, 4]$.

For example, when i is 3, a $k_3^{th}$ block of information is combined with 3 encoded code words $V_2$, $V_1$, and $V_0$ of $k_2^{th}$, $k_1^{th}$, and $k_0^{th}$ blocks, to obtain a code word to be encoded; and then, encoding is performed, by using an LDPC check matrix, on the code word to be encoded, where a generated check bit and the $k_3^{th}$ block of information form an encoded code word $V_3$. It should be noted that $V_2$ is an encoded code word that is obtained after the $k_2^{th}$ block of information is encoded by adopting the same encoding method, that is, the $k_2^{th}$ block of information is combined with 3 encoded code words $V_1$, $V_0$, and $V_{-1}$ of $k_1^{th}$, $k_0^{th}$, and $k_{-1}^{th}$ blocks, to obtain a code word to be encoded, and then encoding is performed, by using an LDPC check matrix, on the code word to be encoded, where a generated check bit and the $k_2^{th}$ block of information form an encoded code word $V_2$. Similarly, $V_1$ that exists in a process of encoding the $k_3^{th}$ block of information and the $k_2^{th}$ block of information is an encoded code word that is obtained after the $k_1^{th}$ block of information is encoded by adopting the same encoding method, that is, the $k_1^{th}$ block of information is combined with 3 encoded code words $V_0$, $V_{-1}$, and $V_{-2}$ of $k_0^{th}$, $k_{-1}^{th}$, and $k_{-2}^{th}$ blocks, to obtain a code word to be encoded, and then encoding is performed, by using an LDPC check matrix, on the code word to be encoded, where a generated check bit and the $k_1^{th}$ block of information form the encoded code word $V_1$. Specifically, the encoded code words $V_0$, $V_{-1}$, and $V_{-2}$ are history information, and $V_0$, $V_{-1}$, and $V_{-2}$ may be set to 0. It can be seen that in a process of encoding the $k_i^{th}$ block of information, a value of i is assigned in ascending order from 1 to 4, that is, the $k_1^{th}$ block of information to a $k_4^{th}$ block of information are input in turn for encoding. A specific process may be described as follows.

Input a $k_1^{th}$ block of data, with reference to a check relation of an $H1L^{th}$ layer in the check matrix H, combine the $k_1^{th}$ block of data with encoded code words $V_0$, $V_{-1}$, and $V_{-2}$ of $k_0^{th}$, $k_{-1}^{th}$, and $k_{-2}^{th}$ blocks after encoding, to obtain a code word to be encoded, where the code word to be encoded is a combination of 4 blocks of data, and perform, by using an LDPC check matrix, encoding on the code word to be encoded, where a generated check bit and $k_1$ form an encoded code word $V_1$. $k_0^{th}$, $k_{-1}^{th}$, and $k_{-2}^{th}$ blocks of data represent data blocks that are encoded before the $k_1^{th}$ block of data, and the encoded code words $V_0$, $V_{-1}$, and $V_{-2}$ of the $k_0^{th}$, $k_{-1}^{th}$, and $k_{-2}^{th}$ blocks of data after encoding are history information. In this embodiment, because the $k_1^{th}$ block is used as a first block of data for encoding, the $k_0^{th}$, $k_{-1}^{th}$, and $k_{-2}^{th}$ blocks of data are assigned a preset value 0, and the encoded code words $V_0$, $V_{-1}$, and $V_{-2}$ of the $k_0^{th}$, $k_{-1}^{th}$, and $k_{-2}^{th}$ blocks after encoding are also 0.

Input a $k_2^{th}$ block of data, with reference to a check relation of an $H2L^{th}$ layer in the check matrix H, combine the $k_2^{th}$ block of data with encoded code words $V_1$, $V_0$, and $V_{-1}$ of $k_1^{th}$, $k_0^{th}$, and $k_{-1}^{th}$ blocks after encoding, to obtain a code word to be encoded, where the code word to be encoded is a combination of 4 blocks of data, and perform, by using an LDPC check matrix, encoding on the code word to be encoded, where a generated check bit and $k_2$ form an encoded code word $V_2$. $V_1$ is an encoded code word of a previous $k_1^{th}$ block of data.

Input a $k_3^{th}$ block of data, with reference to a check relation of an $H3L^{th}$ layer in the check matrix H, combine the $k_3^{th}$ block of data with encoded code words $V_2$, $V_1$, and $V_0$ of $k_2^{th}$, $k_1^{th}$, and $k_0^{th}$ blocks after encoding, to obtain a code word to be encoded, where the code word to be encoded is a combination of 4 blocks of data, and perform, by using an LDPC check matrix, encoding on the code word to be encoded, where a generated check bit and $k_3$ form an encoded code word $V_3$.

Input a $k_4{}^{th}$ block of data, with reference to a check relation of an $H4L^{th}$ layer in the check matrix H, combine the $k_4{}^{th}$ block of data with encoded code words $V_3, V_2,$ and $V_1$ of $k_3{}^{th}$, $k_2{}^{th}$, and $k_1{}^{th}$ blocks after encoding, to obtain a code word to be encoded, where the code word to be encoded is a combination of 4 blocks of data, and perform, by using an LDPC check matrix, encoding on the code word to be encoded, where a generated check bit and $k_4$ form an encoded code word $V_4$.

The finally obtained $V_1, V_2, V_3,$ and $V_4$ are encoded code words of input data $k_1, k_2, k_3,$ and $k_4$, and the encoded code words $V_1, V_2, V_3,$ and $V_4$ are output from an encoding device in order, and an encoding process is completed.

It should be noted that such values as m=4, n=4, and N=24 in this embodiment of the present invention are just exemplary values, and m may be any positive integer, n is smaller than N, and a value of N/n is a positive integer.

With the encoding method provided in this embodiment of the present invention, the input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

An embodiment of the present invention provides a decoding method corresponding to the foregoing encoding method. With reference to a check matrix H shown in FIG. 3b, in the same way, assume m=4, n=4, and N=24, and assume the specified number of times I=6. The specified number of times refers to the number of extension times of the check matrix H. The larger the number of extension times of the check matrix H is, the larger the number of decoding check times performed in a decoding process is, and the better performance of the decoding is. The specified number of times is the number of decoding processing units. The specified number of times may be set manually. In theory, the larger the specified number of times is, the better. However, with the increase of the specified number of times, more decoding processing units are required, so that a cost is also higher. Here, the specified number of times I=6 may be preferably selected, that is, a six-stage decoding processing process needs to be performed. A specific decoding process may be described as follows.

Form input encoded code words $V_i, V_{i-1}, V_{i-2},$ and $V_{i-3}$ into one code word, and perform decoding by using an LDPC check matrix, to obtain a $k_i{}^{th}$ block of information, where $i \in [1, 4]$.

Being corresponding to an encoding process, in a process of decoding $V_i$, a value of i is assigned in ascending order from 1 to 4, that is, a decoding device performs decoding on encoded code words $V_1, V_2, V_3,$ and $V_4$ that are input in turn.

Input an encoded code word $V_1$ into the decoding device, with reference to a check relation of an $H1L^{th}$ layer in the check matrix H, form $V_1$ and $V_0, V_{-1},$ and $V_{-2}$ into one code word, in a first-stage decoding processing process, perform decoding on the code word by using an LDPC check matrix, and output $V'_1, V'_0, V'_{-1},$ and $V'_{-2}$ and cached data $C_1, C_0, C_{-1},$ and $C_{-2}$; in a second-stage decoding processing process, perform decoding on code words $V'_1, V'_0, V'_{-1},$ and $V'_{-2}$ and the cached data $C_1, C_0, C_{-1},$ and $C_{-2}$ by using the LDPC check matrix, where the code words $V'_1, V'_0, V'_{-1},$ and $V'_{-2}$ and the cached data $C_1, C_0, C_{-1},$ and $C_{-2}$ are output in the first stage, and output $V^2{}_1, V^2{}_0, V^2{}_{-1},$ and $V^2{}_{-2}$ and updated cached data $C'_1, C'_0, C'_{-1},$ and $C'_{-2}$; and the rest may be deduced by analogy, and in a sixth-stage decoding processing process, perform decoding on code words $V^5{}_1, V^5{}_0, V^5{}_{-1},$ and $V^5{}_{-2}$ and cached data $C^4{}_1, C^4{}_0, C^4{}_{-1},$ and $C^4{}_{-2}$ by using the LDPC check matrix, where the code words $V^5{}_1, V^5{}_0, V^5{}_{-1},$ and $V^5{}_{-2}$ and the cached data $C^4{}_1, C^4{}_0, C^4{}_{-1},$ and $C^4{}_{-2}$ are output in a fifth stage, and output $k_1, k_0, k_{-1},$ and $k_{-2}$. $V_0{}^{th}, V_{-1}{}^{th},$ and $V_{-2}{}^{th}$ blocks of data represent encoded code words before a $V_1{}^{th}$ block of data. In this embodiment, because the $V_1{}^{th}$ block is used as a first block of data for decoding, the $V_0{}^{th}, V_{-1}{}^{th},$ and $V_{-2}{}^{th}$, blocks of data are assigned a preset value 0, and $k_0, k_{-1},$ and $k_{-2}$ obtained after decoding of the $V_0{}^{th}, V_{-1}{}^{th},$ and $V_{-2}{}^{th}$ blocks are also 0.

Input an encoded code word $V_2$ into the decoding device, with reference to a check relation of an $H2L^{th}$ layer in the check matrix H, form $V_2$ and $V_1, V_0,$ and $V_{-1}$ into one code word, in a first-stage decoding processing process, perform decoding on the code word by using an LDPC check matrix, and output $V'_2, V'_1, V'_0,$ and $V'_{-1}$ and cached data $C_2, C_1, C_0,$ and $C_{-1}$; in a second-stage decoding processing process, perform decoding on code words $V'_2, V'_1, V'_0,$ and $V'_{-1}$ and the cached data $C_2, C_1, C_0,$ and $C_{-1}$ by using the LDPC check matrix, where the code words $V'_2, V'_1, V'_0,$ and $V'_{-1}$ and the cached data $C_2, C_1, C_0,$ and $C_{-1}$ are output in the first stage, and output $V^2{}_2, V^2{}_1, V^2{}_0,$ and $V^2{}_{-1}$ and updated cached data $C'_2, C'_1, C'_0,$ and $C'_{-1}$; and the rest may be deduced by analogy, and in a sixth-stage decoding processing process, perform decoding on code words $V^5{}_2, V^5{}_1, V^5{}_0,$ and $V^5{}_{-1}$ and cached data $C^4{}_2, C^4{}_1, C^4{}_0,$ and $C^4{}_{-1}$ by using the LDPC check matrix, where the code words $V^5{}_2, V^5{}_1, V^5{}_0,$ and $V^5{}_{-1}$ and the cached data $C^4{}_2, C^4{}_1, C^4{}_0,$ and $C^4{}_{-1}$ are output in a fifth stage, and output $k_2, k_1, k_0,$ and $k_{-1}$. $V_1$ used for forming the code word of decoding is the encoded code word $V_1$ that has been input into the decoding device previously.

Input an encoded code word $V_3$ into the decoding device, with reference to a check relation of an $H3L^{th}$ layer in the check matrix H, form $V_3$ and $V_2, V_1,$ and $V_0$ into one code word, in a first-stage decoding processing process, perform decoding on the code word by using an LDPC check matrix, and output $V'_3, V'_2, V'_1,$ and $V'_0$ and cached data $C_3, C_2, C_1,$ and $C_0$; in a second-stage decoding processing process, perform decoding on code words $V'_3, V'_2, V'_1,$ and $V'_0$ and the cached data $C_3, C_2, C_1,$ and $C_0$ by using the LDPC check matrix, where the code words $V'_3, V'_2, V'_1,$ and $V'_0$ and the cached data $C_3, C_2, C_1,$ and $C_0$ are output in the first stage, and output $V^2{}_3, V^2{}_2, V^2{}_1,$ and $V^2{}_0$ and updated cached data $C'_3, C'_2, C'_1, C'_0$; and the rest may be deduced by analogy, and in a sixth-stage decoding processing process, perform decoding on code words $V^5{}_3, V^5{}_2, V^5{}_1,$ and $V^5{}_0$ and cached data $C^4{}_3, C^4{}_2, C^4{}_1,$ and $C^4{}_0$ by using the LDPC check matrix, where the code words $V^5{}_3, V^5{}_2, V^5{}_1,$ and $V^5{}_0$ and the cached data $C^4{}_3, C^4{}_2, C^4{}_1,$ and $C^4{}_0$ are output in a fifth stage, and output $k_3, k_2, k_1,$ and $k_0$.

Input an encoded code word $V_4$ into the decoding device, with reference to a check relation of an $H4L^{th}$ layer in the check matrix H, form $V_4$ and $V_3, V_2,$ and $V_1$ into one code word, in a first-stage decoding processing process, perform decoding on the code word by using an LDPC check matrix, and output $V'_4, V'_3, V'_2,$ and $V'_1$ and cached data $C_4, C_3, C_2,$ and $C_1$; in a second-stage decoding processing process, perform decoding on code words $V'_4$, $V'_3$, $V'_2$, and $V'_1$ and the cached data $C_4$, $C_3$, $C_2$, and $C_1$ by using the LDPC check matrix, where the code words $V'_4$, $V'_3$, $V'_2$, and $V'_1$ and the cached data $C_4$, $C_3$, $C_2$, and $C_1$ are output in the first stage, and output $V^2_4$, $V^2_3$, $V^2_2$, and $V^2_1$ and updated cached data $C'_4$, $C'_3$, $C'_2$, and $C'_1$; and the rest may be deduced by analogy, and in a sixth-stage decoding processing process, perform decoding on code words $V^5_4$, $V^5_3$, $V^5_2$, and $V^5_1$ and cached data $C^4_4$, $C^4_3$, $C^4_2$, and $C^4_1$ by using the LDPC check matrix, where the code words $V^5_4$, $V^5_3$, $V^5_2$, and $V^5_1$ and the cached data $C^4_4$, $C^4_3$, $C^4_2$, and $C^4_1$ are output in a fifth stage, and output $k_4$, $k_3$, $k_2$, and $k_1$.

After the decoding of the encoded code word $V_4$ of a last block is completed, a decoding process ends, the finally output $k_4$, $k_3$, $k_2$, and $k_1$ are decoding results of $V_4$, $V_3$, $V_2$, and $V_1$, the decoding device performs recombination in an order of $k_1$, $k_2$, $k_3$, and $k_4$ to obtain K-bit information, the decoding device outputs the K-bit information, and the decoding is completed.

It should be noted that such values as m=4, n=4, N=24, and the specified number of times I=6 in this embodiment of the present invention are just exemplary values, and m and I may be any positive integer, n is smaller than N, and a value of N/n is a positive integer.

With the decoding method provided in this embodiment of the present invention, input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

Figure 4A:
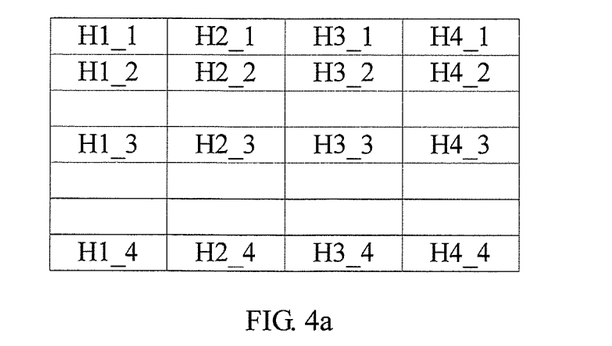
FIG. 4a is a schematic diagram of another original check matrix.
Figure 4B:
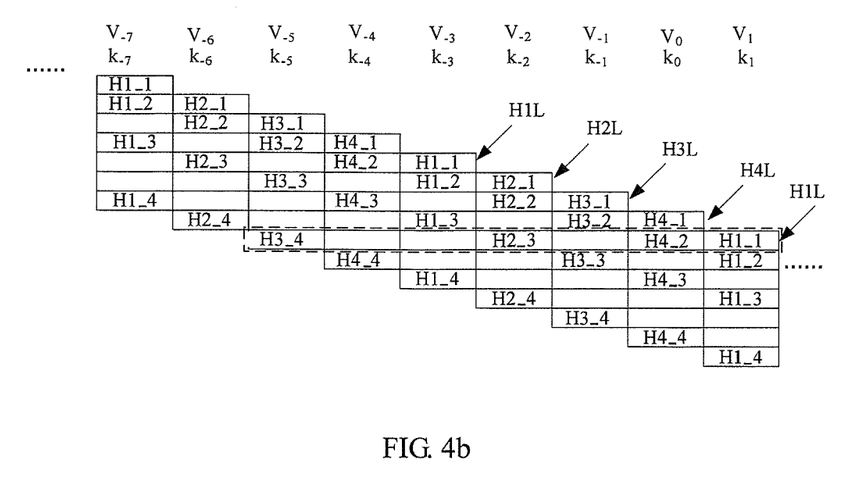
FIG. 4b is a schematic diagram of another check matrix obtained through extension and transformation according to an embodiment of the present invention.

An embodiment of the present invention further provides an encoding and decoding method by adopting a concatenated pipelined convolution and based on an interleaved check matrix. An original check matrix in FIG. 4a is an interleaved check matrix. Compared with the original check matrix shown in FIG. 3a, the interleaved check matrix has an empty layer, and the number of non-empty layers is m. Because interleaving methods are numerous, positions and the number of empty layers may be random, and the original check matrix shown in FIG. 4a is just one example. A check matrix obtained through extension and transformation according to a method of shifting down column by column is shown in FIG. 4b, where assume m=4, n=4, and N=24, and H1L, H2L, H3L, and H4L are used respectively to represent a check equation of each layer cyclically. A specific encoding process may be described as follows.

Equally divide input K-bit information into 4 blocks, where $k_1$, $k_2$, $k_3$, and $k_4$ are used to represent each block of information.

Combine a $k_i^{th}$ block of information with 3 encoded code words $V_{i-1}$, $V_{i-2}$, and $V_{i-3}$ of $k_{i-1}^{th}$ $k_{i-2}^{th}$, and $k_{i-3}^{th}$ blocks, to obtain a code word to be encoded.

Perform, by using an LDPC check matrix, encoding on the code word to be encoded, where a generated check bit and the $k_i^{th}$ block of information form an encoded code word $V_i$, where $i \in [1, 4]$.

For example, when i is 3, a $k_3^{th}$ block of information is combined with 3 encoded code words $V_2$, $V_1$, and $V_0$ of $k_2^{th}$, $k_1^{th}$, and $k_0^{th}$ blocks, to obtain a code word to be encoded. Then, encoding is performed, by using an LDPC check matrix, on the code word to be encoded, where a generated check bit and the $k_3^{th}$ block of information form an encoded code word $V_3$. It should be noted that $V_2$ is an encoded code word that is obtained after the $k_2^{th}$ block of information is encoded by adopting the same encoding method, that is, the $k_2^{th}$ block of information is combined with 3 encoded code words $V_1$, $V_0$, and $V_{-1}$ of $k_1^{th}$, $k_0^{th}$, and $k_{-1}^{th}$ blocks, to obtain a code word to be encoded, and then encoding is performed, by using an LDPC check matrix, on the code word to be encoded, where a generated check bit and the $k_2^{th}$ block of information form an encoded code word $V_2$. Similarly, $V_1$ that exists in a process of encoding the $k_3^{th}$ block of information and the $k_2^{th}$ block of information is an encoded code word that is obtained after the $k_1^{th}$ block of information is encoded by adopting the same encoding method, that is, the $k_1^{th}$ block of information is combined with 3 encoded code words $V_0$, $V_{-1}$, and $V_{-2}$ of $k_0^{th}$, $k_{-1}^{th}$, and $k_{-2}^{th}$ blocks, to obtain a code word to be encoded, and then encoding is performed, by using an LDPC check matrix, on the code word to be encoded, where a generated check bit and the $k_1^{th}$ block of information form the encoded code word $V_1$. Specifically, the encoded code words $V_0$, $V_{-1}$, and $V_{-2}$ are history information, and $V_0$, $V_{-1}$, and $V_{-2}$ may be set to 0. It can be seen that in a process of encoding the $k_i^{th}$ block of information, a value of i is assigned in ascending order from 1 to 4, that is, the $k_1^{th}$ block of information to a $k_4^{th}$ block of information are input in turn for encoding. A specific process may be described as follows.

Input a $k_1^{th}$ block of data, with reference to a check relation of an H1L$^{th}$ layer in a check matrix H, combine the $k_1^{th}$ block of data with encoded code words $V_0$, $V_{-1}$, and $V_{-2}$ of $k_0^{th}$, $k_{-1}^{th}$, and $k_{-2}^{th}$ blocks after encoding, to obtain a code word to be encoded, where the code word to be encoded is a combination of 4 blocks of data, and perform, by using an LDPC check matrix, encoding on the code word to be encoded, where a generated check bit and $k_1$ form an encoded code word $V_1$. $k_0^{th}$, $k_{-1}^{th}$, and $k_{-2}^{th}$ blocks of data are assigned with a preset value 0, and the encoded code words $V_0$, $V_{-1}$, and $V_{-2}$ of the $k_0^{th}$, $k_{-1}^{th}$, and $k_{-2}^{th}$ blocks after encoding are also 0.

It should be noted that the input data of the $k_1^{th}$, $k_0^{th}$, $k_{-1}^{th}$, and $k_{-2}^{th}$ blocks and the encoded code words $V_1$, $V_0$, $V_{-1}$, and $V_{-2}$ all refer to logical blocks, that is, a block of input data or encoded code words with contiguous sequence numbers are logically contiguous. In the previous embodiment, the check matrix is non-interleaved, so that a logical block number is an actual data block number; and in this embodiment of the present invention, reference may be made to the check matrix shown in FIG. 4b, the input data of the $k_1^{th}$, $k_0^{th}$, $k_{-1}^{th}$, and $k_{-2}^{th}$ blocks respectively corresponds to actual data of $k_1^{th}$, $k_0^{th}$, $k_{-2}^{th}$, and $k_{-5}^{th}$ blocks, and the encoded code words $V_1$, $V_0$, $V_{-1}$, and $V_{-2}$ respectively correspond to encoded code words $V_1$, $V_0$, $V_{-2}$, $V_{-5}$.

Reference may be made in the following to an encoding method in which a check matrix is non-interleaved, until a $k_4^{th}$ block of data is input, with reference to a check relation of an H4L$^{th}$ layer in the check matrix H, the $k_4^{th}$ block of data is combined with encoded code words $V_3$, $V_2$, and $V_1$ of $k_3^{th}$, $k_2^{th}$, and $k_1^{th}$ blocks after encoding, to obtain a code word to be encoded, where the code word to be encoded is a combination of 4 blocks of data, and encoding is performed, by using an LDPC check matrix, on the code word to be encoded, where a generated check bit and $k_4$ form an encoded code word $V_4$. Input data of the $k_4^{th}$, $k_3^{th}$, $k_2^{th}$, and $k_1^{th}$ blocks respectively corresponds to actual data of the $k_4^{th}$, $k_3^{th}$, $k_1^{th}$, and $k_{-2}{}^{th}$ blocks, and encoded code words $V_4$, $V_3$, $V_2$, $V_1$ respectively correspond to encoded code words $V_4$, $V_3$, $V_1$, and $V_{-2}$.

The finally obtained $V_1$, $V_2$, $V_3$, and $V_4$ are encoded code words of input data $k_1$, $k_2$, $k_3$, and $k_4$, and the encoded code words $V_1$, $V_2$, $V_3$, and $V_4$ are output from an encoding device in order, and an encoding process is completed.

Referring to the check matrix shown in FIG. 4b, in the same way, assume m=4, n=4, and N=24, and assume the specified number of times I=6, and a corresponding decoding method may be described as follows.

Form input encoded code words $V_i$, $V_{i-1}$, $V_{i-2}$, and $V_{i-3}$ into one code word, and perform decoding by using an LDPC check matrix, to obtain a $k_i{}^{th}$ block of information, where i∈[1, 4].

Being corresponding to an encoding process, in a process of decoding $V_i$, a value of i is assigned in ascending order from 1 to 4, that is, a decoding device performs decoding on encoded code words $V_1$, $V_2$, $V_3$, and $V_4$ that are input in turn.

Input an encoded code word $V_1$ into the decoding device, with reference to a check relation of an $H1L^{th}$ layer in the check matrix H, form $V_1$ and $V_0$, $V_{-1}$, and $V_{-2}$ into one code word, in a first-stage decoding processing process, perform decoding on the code word by using an LDPC check matrix, and output $V'_1$, $V'_0$, $V'_{-1}$, and $V'_{-2}$ and cached data $C_1$, $C_0$, $C_{-1}$, and $C_{-2}$; in a second-stage decoding processing process, perform decoding on code words $V'_1$, $V'_0$, $V'_{-1}$, and $V'_{-2}$ and the cached data $C_1$, $C_0$, $C_{-1}$, and $C_{-2}$ by using the LDPC check matrix, where the code words $V'_1$, $V'_0$, $V'_{-1}$, and $V'_{-2}$ and the cached data $C_1$, $C_0$, $C_{-1}$, and $C_{-2}$ are output in the first stage, and output $V^2{}_1$, $V^2{}_0$, $V^2{}_{-1}$, and $V^2{}_{-2}$ and updated cached data $C'_1$, $C'_0$, $C'_{-1}$, and $C'_{-2}$; and the rest may be deduced by analogy, and in a sixth-stage decoding processing process, perform decoding on code words $V^5{}_1$, $V^5{}_0$, $V^5{}_{-1}$, and $V^5{}_{-2}$ and cached data $C^4{}_1$, $C^4{}_0$, $C^4{}_{-1}$, and $C^4{}_{-2}$ by using the LDPC check matrix, where the code words $V^5{}_1$, $V^5{}_0$, $V^5{}_{-1}$, and $V^5{}_{-2}$ and the cached data $C^4{}_1$, $C^4{}_0$, $C^4{}_{-1}$, and $C^4{}_{-2}$ are output in a fifth stage, and output $k_1$, $k_0$, $k_{-1}$, and $k_{-2}$. $V_0{}^{th}$, $V_{-1}{}^{th}$, and $V_{-2}{}^{th}$ blocks of data are assigned a preset value 0, and $k_0$, $k_{-1}$, and $k_{-2}$ obtained after decoding of the $V_0{}^{th}$, $V_{-1}{}^{th}$, and $V_{-2}{}^{th}$ blocks are also 0.

Being similar to the encoding process, the encoded code words $V_1$, $V_0$, $V_{-1}$, and $V_{-2}$ and the input data of the $k_1{}^{th}$, $k_0{}^{th}$, $k_{-1}{}^{th}$, and $k_{-2}{}^{th}$ blocks all refer to logical blocks. In this embodiment of the present invention, reference may be made to the check matrix shown in FIG. 4b, the encoded code words $V_1$, $V_0$, $V_{-1}$, and $V_{-2}$ respectively correspond to encoded code words $V_1$, $V_0$, $V_{-2}$, and $V_{-5}$, and the input data of the $k_1{}^{th}$, $k_0{}^{th}$, $k_{-1}{}^{th}$, and $k_{-2}{}^{th}$ blocks respectively corresponds to actual data of $k_1{}^{th}$, $k_0{}^{th}$, $k_{-2}{}^{th}$, and $k_{-5}{}^{th}$ blocks.

Reference may be made in the following to a decoding method in which a check matrix is non-interleaved, until an encoded code word $V_4$ is input into the decoding device, with reference to a check relation of an $H4L^{th}$ layer in the check matrix H, form $V_4$ and $V_3$, $V_2$, and $V_1$ into one code word, in a first-stage decoding processing process, perform decoding on the code word by using an LDPC check matrix, and output $V'_4$, $V'_3$, $V'_2$, and $V'_1$, and cached data $C_4$, $C_3$, $C_2$, and $C_1$; in a second-stage decoding processing process, perform decoding on code words $V'_4$, $V'_3$, $V'_2$, and $V'_1$ and the cached data $C_4$, $C_3$, $C_2$, and $C_1$ by using the LDPC check matrix, where the code words $V'_4$, $V'_3$, $V'_2$, and $V'_1$ and the cached data $C_4$, $C_3$, $C_2$, and $C_1$ are output in the first stage, and output $V^2{}_4$, $V^2{}_3$, $V^2{}_2$, and $V^2{}_1$ and updated cached data $C'_4$, $C'_3$, $C'_2$, $C'_1$; and the rest may be deduced by analogy, and in a sixth-stage decoding processing process, perform decoding on code words $V^5{}_4$, $V^5{}_3$, $V^5{}_2$, $V^5{}_1$ and cached data $C^4{}_4$, $C^4{}_3$, $C^4{}_2$, $C^4{}_1$ by using the LDPC check matrix, where the code words $V^5{}_4$, $V^5{}_3$, $V^5{}_2$, $V^5{}_1$ and the cached data $C^4{}_4$, $C^4{}_3$, $C^4{}_2$, $C^4{}_1$ are output in a fifth stage, and output $k_4$, $k_3$, $k_2$, and $k_1$. Encoded code words $V_4$, $V_3$, $V_2$, and $V_1$ respectively correspond to encoded code words $V_4$, $V_3$, $V_1$, and $V_{-2}$, and input data of $k_4{}^{th}$, $k_3{}^{th}$, $k_2{}^{th}$, and $k_1{}^{th}$ blocks respectively corresponds to actual data of $k_4{}^{th}$, $k_3{}^{th}$, $k_1{}^{th}$, and $k_{-2}{}^{th}$ blocks.

After the decoding of the encoded code word $V_4$ of a last block is completed, a decoding process ends, the finally output $k_4$, $k_3$, $k_2$, and $k_1$ are decoding results of $V_4$, $V_3$, $V_2$, and $V_1$, the decoding device performs recombination in an order of $k_1$, $k_2$, $k_3$, and $k_4$ to obtain K-bit information, the decoding device outputs the K-bit information, and the decoding is completed.

It should be noted that such values as m=4, n=4, N=24, and the specified number of times I=6 in this embodiment of the present invention are just exemplary values, and m and I may be any positive integer, n is smaller than N, and a value of N/n is a positive integer. After a check matrix is interleaved, a corresponding relation between logical block numbers of input data and an encoded code word and actual data block numbers is not unique, a corresponding relation between logical block numbers of input data and an encoded code word and actual data block numbers in the encoding and decoding method provided in this embodiment of the present invention is only exemplary. Any other corresponding relation that is between logical block numbers and actual data block numbers and generated by interleaving the check matrix is applicable to the method provided in this embodiment of the present invention, and shall all fall within the protection scope of the present invention.

With the encoding method and decoding method provided in this embodiment of the present invention, the input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

Figure 5:
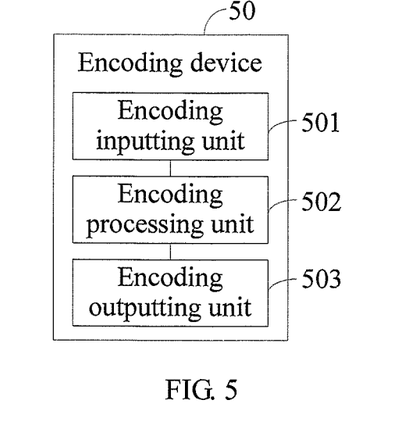
FIG. 5 is a schematic structural diagram of an encoding device according to an embodiment of the present invention.

An encoding device 50 provided in an embodiment of the present invention as shown in FIG. 5, includes:

an encoding inputting unit 501, configured to input K-bit information;

an encoding processing unit 502, configured to equally divide the input K-bit information into n blocks, where $k_1$, $k_2$, ..., and $k_n$ are used to represent each block of information; combine a $k_i{}^{th}$ block of information with n−1 encoded code words $V_{i-1}$, $V_{i-2}$, ..., and $V_{i-n+1}$ of $k_{i-1}{}^{th}$, $k_{i-2}{}^{th}$, ..., and $k_{i-n+1}{}^{th}$ blocks, to obtain a code word to be encoded, where when a sequence number of an encoded code word is smaller than or equal to 0, the encoded code word is history information; and perform, by using an LDPC check matrix, encoding on the code word to be encoded, where a generated check bit and the $k_i{}^{th}$ block of information form an encoded code word $V_i$; and an encoding outputting unit 503, configured to output encoded code words $V_1$, $V_2$, ..., and $V_n$.

The LDPC check matrix includes m layers, each layer includes N sub-matrixes, the N sub-matrixes are equally divided into n blocks according to columns, and each block includes N/n sub-matrixes, where i∈[1, n], and N, m, n, and i are all positive integers.

With the encoding device provided in this embodiment of the present invention, the input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

Figure 6:
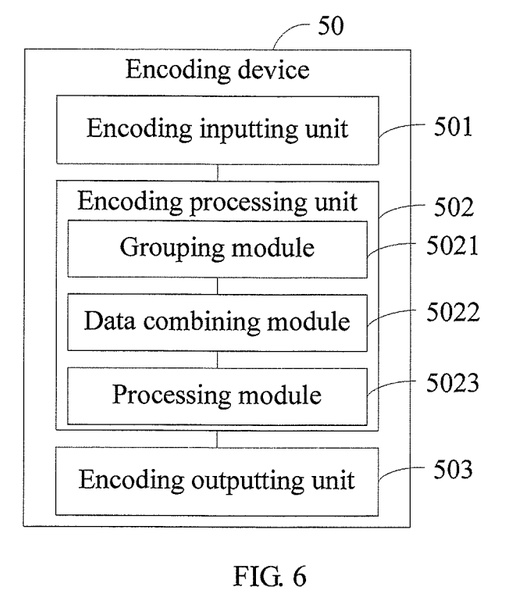
FIG. 6 is a schematic structural diagram of another encoding device according to an embodiment of the present invention.

Further, as shown in FIG. 6, an encoding processing unit 502 includes:

a blocking module 5021, configured to equally divide input K-bit information into n blocks, where $k_1, k_2, \ldots,$ and $k_n$ are used to represent each block of information;

a data combining module 5022, configured to combine a $k_i^{th}$ block of information with n−1 encoded code words $V_{i-1}, V_{i-2}, \ldots,$ and $V_{i-n+1}$ of $k_{i-1}^{th}, k_{-2}^{th}, \ldots,$ and $k_{i-n+1}^{th}$ blocks, to obtain a code word to be encoded, where when a sequence number of an encoded code word is smaller than or equal to 0, the encoded code word is history information; and a processing module 5023, configured to perform, by using an LDPC check matrix, encoding on the code word to be encoded, where a generated check bit and the $k_i^{th}$ block of information form an encoded code word $V_i$.

Figure 7:
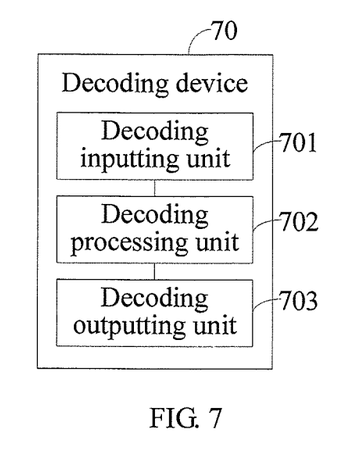
FIG. 7 is a schematic structural diagram of a decoding device according to an embodiment of the present invention.

A decoding device 70 provided in an embodiment of the present invention as shown in FIG. 7, includes:

a decoding inputting unit 701, configured to input encoded code words $V_i, V_{i-1}, V_{i-2}, \ldots,$ and $V_{i-n+1}$;

at least one decoding processing unit 702, configured to form the input encoded code words $V_i, V_{i-1}, V_{i-2}, \ldots,$ and $V_{i-n+1}$ into one code word, and perform decoding by using an LDPC check matrix, to obtain a $k_i^{th}$ block of information, where when a sequence number of an encoded code word is smaller than or equal to 0, the encoded code word is history information; and after obtaining $k_1^{th}, k_2^{th}, \ldots,$ and $k_n^{th}$ blocks of information after the decoding, combine them to obtain K-bit information; and a decoding outputting unit 703, configured to output the K-bit information.

The LDPC check matrix includes m layers, each layer includes N sub-matrixes, the N sub-matrixes are equally divided into n blocks according to columns, and each block includes N/n sub-matrixes, where i∈[1, n], and N, m, n, and i are all positive integers.

With the decoding device provided in this embodiment of the present invention, input K-bit information is equally divided into n blocks, so that a code length of information processed at a single time changes from a code length N of information processed at a single time in an existing LDPC encoding and decoding process to N/n (n is a positive integer). In this way, the code length of the information processed at a single time may be greatly shortened by reasonably selecting the number of blocks n. In another aspect, data input at each time is combined with multiple previously obtained encoded code words for check in an encoding and decoding process. By adopting such a convolutional encoding and decoding check method, a total code length of processing is greatly increased in logic, thereby effectively improving performance of encoding and decoding.

Further, the at least one decoding processing unit 702 is further configured to form the input $V_i, V_{i-1}, V_{i-2}, \ldots,$ and $V_{i-n+1}$ into one code word, and perform decoding by using the LDPC check matrix, to obtain $V'_i, V'_{i-1}, V'_{i-2}, \ldots,$ and $V'_{i-n+1}$ and cached data $C_i, C_{i-1}, C_{i-2},$ and $C_{i-3}$; form the $V'_i, V'_{i-1}, V'_{i-2}, \ldots,$ and $V'_{i-n+1}$ and the cached data $C_i, C_{i-1}, C_{i-2},$ and $C_{i-3}$ into a code word and then perform decoding by using the LDPC check matrix again, and perform the foregoing decoding operation for the specified number of times in this manner, to obtain a $k_i^{th}$ block of information.

Figure 8:
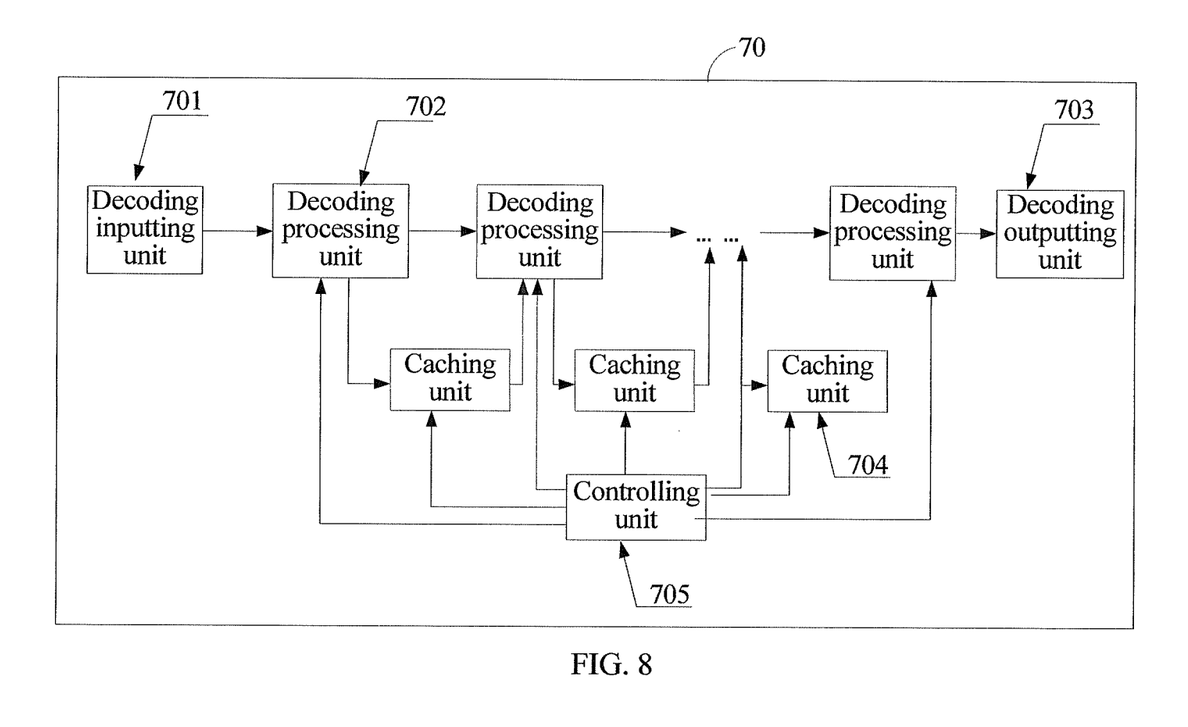
FIG. 8 is a schematic connection diagram of a decoding device according to an embodiment of the present invention.

As shown in FIG. 8, a decoding device 70 further includes:

at least one caching unit 704, configured to store cached data, where the number of caching units 704 is one less than that of decoding processing units 702; and a controlling unit 705, connected to at least one decoding processing unit 702 and the at least one caching unit 704 respectively, and configured to control enabling of the at least one decoding processing unit 702 and the at least one caching unit 704, so as to control a whole decoding procedure.

Figure 9:
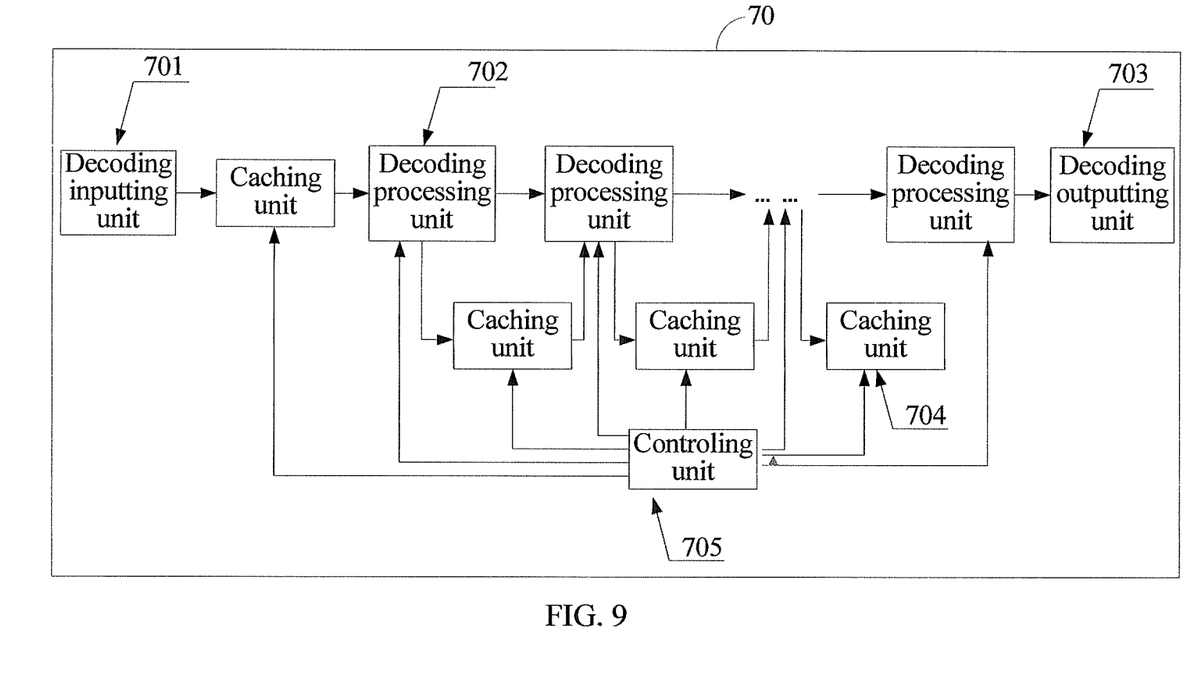
FIG. 9 is a schematic connection diagram of another decoding device according to an embodiment of the present invention.

Further, when decoding is performed in a decoding method that adopts a concatenated pipelined convolutional manner and is based on an interleaved check matrix, as shown in FIG. 9, the number of caching units 704 is equal to that of the decoding processing units 702.

The caching unit 704 is further configured to perform interleaving processing on input data, so that data input into the caching unit 704 is combined with a block of random-interval data, to generate one block of code words that satisfy a check relation of the interleaved check matrix. The data input into the caching unit 704 includes an encoded code word and cached data.

Persons of ordinary skill in the art may understand that all or a part of steps in the foregoing method embodiments may be implemented by a program instructing relevant hardware. The program may be stored in a computer readable storage medium. When the program runs, the steps in the foregoing method embodiments are performed. The storage medium may be any medium that is capable of storing program codes, such as a ROM, a RAM, a magnetic disk, or an optical disk.

The foregoing descriptions are merely specific embodiments of the present invention, but are not intended to limit the protection scope of the present invention. Changes or replacements easily figured out by persons skilled in the art within the technical scope disclosed in the present invention shall all fall within the protection scope of the present invention. Therefore, the protection scope of the present invention shall be subject to that of the appended claims.

What is claimed is:

1. An encoding method, comprising:
   equally dividing input K-bit information into n blocks, wherein $k_1, k_2, \ldots,$ and $k_n$ are used to represent each block of information;
   combining a $k_i^{th}$ block of information with n−1 encoded code words $V_{i-1}, V_{i-2}, \ldots,$ and $V_{i-n+1}$ of $k_{i-1}^{th}, k_{i-2}^{th}, \ldots,$ and $k_{i-n+1}^{th}$ blocks, to obtain a code word to be encoded, wherein when a sequence number of an encoded code word is smaller than or equal to 0, the encoded code word is history information;
   performing, by using a low density parity code LDPC check matrix, encoding on the code word to be encoded, wherein a generated check bit and the $k_i^{th}$ block of information form an encoded code word $V_i$; and
   outputting encoded code words $V_1, V_2, \ldots,$ and $V_n$,
   wherein the LDPC check matrix comprises m layers, each layer comprises N sub-matrixes, the N sub-matrixes are equally divided into n blocks according to columns, and each block comprises N/n sub-matrixes, wherein i∈[1, n], and N, m, n, and i are all positive integers.

2. A decoding method, comprising:

forming input encoded code words $V_i, V_{i-1}, V_{i-2}, \ldots,$ and $V_{i-n+1}$ into one code word, and performing decoding by using an LDPC check matrix, to obtain a $ki^{th}$ block of information, wherein when a sequence number of the encoded code word is smaller than or equal to 0, the encoded code word is history information;

after obtaining $k_1^{th}, k_2^{th}, \ldots,$ and $k_n^{th}$ blocks of information after the decoding, combining them to obtain K-bit information; and outputting the K-bit information, wherein the LDPC check matrix comprises m layers, each layer comprises N sub-matrixes, the N sub-matrixes are equally divided into n blocks according to columns, and each block comprises N/n sub-matrixes, wherein i∈[1, n], and N, m, n, and i are all positive integers.

3. The method according to claim 2, wherein the forming input $V_i, V_{i-1}, V_{i-2}, \ldots,$ and $V_{i-n+1}$ into one code word, and performing decoding by using the LDPC check matrix, to obtain the $ki^{th}$ block of information comprises:

forming the input $V_i, V_{i-1}, V_{i-2}, \ldots,$ and $V_{i-n+1}$ into one code word, and performing decoding by using the LDPC check matrix, to obtain $V'_i, V'_{i-1}, V'_{i-2}, \ldots,$ and $V'_{i-n+1}$ and cached data $C_i, C_{i-1}, C_{i-2},$ and $C_{i-3}$; and forming $V'_i, V'_{i-1}, V'_{i-2}, \ldots,$ and $V'_{i-n+1}$ and the cached data $C_i, C_{i-1}, C_{i-2},$ and $C_{i-3}$ into a code word and then performing decoding by using the LDPC check matrix again, and performing the foregoing decoding operation for the specified number of times in this manner, to obtain the $k_i^{th}$ block of information.

4. The method according to claim 2, wherein n is smaller than N, and a value of N/n is a positive integer.

5. The method according to claim 3, wherein n is smaller than N, and a value of N/n is a positive integer.

6. An encoding device, comprising:

an encoding inputting unit, configured to input K-bit information;

an encoding processing unit, configured to equally divide the input K-bit information into n blocks, wherein $k_1, k_2, \ldots,$ and $k_n$ are used to represent each block of information; combine a $k_i^{th}$ block of information with n−1 encoded code words $V_{i-1}, V_{i-2}, \ldots,$ and $V_{i-n+1}$ of $k_{i-1}^{th}, k_{i-2}^{th}, \ldots, k_{i-n+1}^{th}$ blocks, to obtain a code word to be encoded, wherein when a sequence number of the encoded code word is smaller than or equal to 0, the encoded code word is history information; and perform, by using an LDPC check matrix, encoding on the code word to be encoded, wherein a generated check bit and the $k_i^{th}$ block of information form an encoded code word $V_i$; and an encoding outputting unit, configured to output encoded code words $V_1, V_2, \ldots,$ and $V_n$, wherein the LDPC check matrix comprises m layers, each layer comprises N sub-matrixes, the N sub-matrixes are equally divided into n blocks according to columns, and each block comprises N/n sub-matrixes, wherein i∈[1, n], and N, m, n, and i are all positive integers.

7. The encoding device according to claim 6, wherein the encoding processing unit comprises:

a blocking module, configured to equally divide the input K-bit information into n blocks, wherein $k_1, k_2, \ldots,$ and $k_n$ are used to represent each block of information;

a data combining module, configured to combine the $k_i^{th}$ block of information with n−1 encoded code words $V_{i-1}, V_{i-2}, \ldots,$ and $V_{i-n+1}$ of the $k_{i-1}^{th}, k_{i-2}^{th}, \ldots,$ and $k_{i-n+1}^{th}$ blocks, to obtain a code word to be encoded, wherein when the sequence number of the encoded code word is smaller than or equal to 0, the encoded code word is history information; and a processing module, configured to perform, by using the LDPC check matrix, encoding on the code word to be encoded, wherein the generated check bit and the $k_i^{th}$ block of information form the encoded code word $V_i$.

8. A decoding device, comprising:

a decoding inputting unit, configured to input encoded code words $V_i, V_{i-1}, V_{i-2}, \ldots,$ and $V_{i-n+1}$;

at least one decoding processing unit, configured to form the input encoded code words $V_i, V_{i-1}, V_{i-2}, \ldots,$ and $V_{i-n+1}$ into one code word, and perform decoding by using an LDPC check matrix, to obtain a $k_i^{th}$ block of information, wherein when a sequence number of the encoded code word is smaller than or equal to 0, the encoded code word is history information; and after obtaining $k_1^{th}, k_2^{th}, \ldots,$ and $k_n^{th}$ blocks of information after the decoding, combine them to obtain the K-bit information; and a decoding outputting unit, configured to output the K-bit information, wherein the LDPC check matrix comprises m layers, each layer comprises N sub-matrixes, the N sub-matrixes are equally divided into n blocks according to columns, and each block comprises N/n sub-matrixes, wherein i∈[1, n], and N, m, n, and i are all positive integers.

9. The decoding device according to claim 8, wherein the at least one decoding processing unit is further configured to form input $V_i, V_{i-1}, V_{i-2}, \ldots,$ and $V_{i-n+1}$ into one code word, and perform decoding by using the LDPC check matrix, to obtain $V'_i, V'_{i-1}, V'_{i-2}, \ldots,$ and $V'_{i-n+1}$ and cached data $C_i, C_{i-1}, C_{i-2},$ and $C_{i-3}$; form $V'_i, V'_{i-1}, V'_{i-2}, \ldots,$ and $V'_{i-n+1}$ and the cached data $C_i, C_{i-1}, C_{i-2},$ and $C_{i-3}$ into a code word and then perform decoding by using the LDPC check matrix again, and perform the foregoing decoding operation for the specified number of times in this manner, to obtain the $k_i^{th}$ block of information.

10. The decoding device according to claim 8, wherein the decoding device further comprises:

at least one caching unit, configured to store the cached data; and a controlling unit, connected to the at least one decoding processing unit and the at least one caching unit respectively, and configured to control enabling of the at least one decoding processing unit and the at least one caching unit.

11. The decoding device according to claim 9, wherein the decoding device further comprises:

at least one caching unit, configured to store the cached data; and a controlling unit, connected to the at least one decoding processing unit and the at least one caching unit respectively, and configured to control enabling of the at least one decoding processing unit and the at least one caching unit.

* * * * *